United States Patent
Jin

(10) Patent No.: US 11,810,787 B2
(45) Date of Patent: Nov. 7, 2023

(54) SEMICONDUCTOR STRUCTURE FORMATION METHOD AND MASK

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 252 days.

(21) Appl. No.: 17/218,809

(22) Filed: Mar. 31, 2021

(65) Prior Publication Data

US 2022/0130672 A1   Apr. 28, 2022

(30) Foreign Application Priority Data

Oct. 22, 2020   (CN) .......................... 202011137109.1

(51) Int. Cl.
*H01L 21/033* (2006.01)
*H01L 21/311* (2006.01)
(Continued)

(52) U.S. Cl.
CPC .... *H01L 21/0337* (2013.01); *H01L 21/31144* (2013.01); *H01L 21/76816* (2013.01);
(Continued)

(58) Field of Classification Search
CPC .......... H01L 21/0337; H01L 21/31144; H01L 21/76816; H01L 21/0332; H01L 21/31155;
(Continued)

(56) References Cited

U.S. PATENT DOCUMENTS

| 7,176,041 B2 * | 2/2007 | Lee ......................... H01L 28/91 |
| | | 257/E21.309 |
| 10,672,614 B2 * | 6/2020 | Huang .............. H01L 21/67075 |

(Continued)

*Primary Examiner* — Mark W Tornow
*Assistant Examiner* — David Paul Sedorook
(74) *Attorney, Agent, or Firm* — Crowell & Moring, LLP

(57) ABSTRACT

A semiconductor structure formation method and a mask are provided. One form of the formation method includes: providing a base, including a target layer; forming a mandrel material layer on the base, the mandrel material layer including a first region and a second region encircling the first region; performing ion doping on the mandrel material layer in the second region, the ion doping being suitable for increasing the etching resistance of the mandrel material layer, where the mandrel material layer in the second region serves as an anti-etching layer, and the mandrel material layer in the first region serves as a mandrel layer; forming a first trench that runs through, along a first direction, at least part of the mandrel material layer in the first region, where part of the mandrel material layer in the first region remains at two sides of the first trench along a second direction; forming spacers on side walls of the first trench, so that the spacers form a first groove by encircling; removing the mandrel layer to form second grooves; and etching, using the anti-etching layer and the spacers as masks, the target layer below the first groove and the second grooves, to form the target pattern. In embodiments and implementations of the present disclosure, a pitch between target patterns is further compressed.

20 Claims, 13 Drawing Sheets

(51) Int. Cl.
  *H01L 21/768* (2006.01)
  *H01L 21/3215* (2006.01)
  *H01L 21/3115* (2006.01)

(52) U.S. Cl.
  CPC ..... *H01L 21/0332* (2013.01); *H01L 21/31155* (2013.01); *H01L 21/3215* (2013.01); *H01L 21/32155* (2013.01)

(58) Field of Classification Search
  CPC ........... H01L 21/3215; H01L 21/32155; H01L 21/32134; H01L 2221/101
  See application file for complete search history.

(56) References Cited

U.S. PATENT DOCUMENTS

2010/0267238 A1* 10/2010 Johnson ............ H01L 29/66795
　　　　　　　　　　　　　　　　　　　　　　438/692
2014/0057436 A1*  2/2014 Chen ................. H01L 21/76816
　　　　　　　　　　　　　　　　　　　　　　257/E21.586
2019/0157094 A1*  5/2019 Lin .................... H01L 21/76811
2021/0134659 A1*  5/2021 Wei ................... H01L 21/76831

* cited by examiner

SEMICONDUCTOR STRUCTURE FORMATION METHOD AND MASK

RELATED APPLICATIONS

The present application claims priority to Chinese Patent Appln. No. 202011137109.1, filed Oct. 22, 2020, the entire disclosure of which is hereby incorporated by reference.

BACKGROUND

Technical Field

Embodiments of the present disclosure relate to the field of semiconductor manufacturing, and in particular, to a semiconductor structure formation method and a mask.

Related Art

With the rapid growth of the semiconductor integrated circuit (IC) industry, semiconductor technology continues to develop toward smaller process nodes driven by Moore's Law, such that ICs develop toward a direction of smaller size, higher circuit precision, and higher circuit complexity.

In the development process of ICs, generally, as a functional density (that is, a quantity of interconnection structures per chip) gradually increases, a geometric size (that is, the smallest component size that can be produced by using process steps) gradually decreases, which correspondingly increases a difficulty and complexity of manufacturing ICs.

Currently, as technological nodes become increasingly small, how to increase a matching degree between a pattern formed on a wafer and a target pattern has become a challenge.

SUMMARY

A problem to be addressed in embodiments and implementations of the present disclosure is to provide a semiconductor structure formation method and a mask, to further compress a pitch between target patterns.

To address the foregoing objective, embodiments and implementations of the present disclosure provide a semiconductor structure formation method, including: providing a base that includes a target layer used for forming a target pattern; forming a mandrel material layer on the base, where the mandrel material layer includes a first region used for forming a mandrel layer, and a second region encircling the first region and used for forming an anti-etching layer; performing ion doping on the mandrel material layer in the second region, the ion doping being suitable for increasing the etching resistance of the mandrel material layer, where the mandrel material layer doped with ions that is located in the second region serves as the anti-etching layer, and the mandrel material layer not doped with ions that is located in the first region serves as the mandrel layer; forming a first trench that runs through, along a first direction, at least part of the mandrel material layer in the first region, where a direction perpendicular to the first direction is a second direction, and part of the mandrel material layer in the first region remains at two sides of the first trench along the second direction; forming spacers on side walls of the first trench, so that the spacers form a first groove by encircling; removing the mandrel layer after the ion doping is performed and the spacers are formed, and forming second grooves in the anti-etching layer that are located at two sides of the first groove; and etching, by using the anti-etching layer and the spacers as masks, the target layer below the first groove and the second grooves, to form the target pattern.

In some implementations, in the step of forming the first trench, the first trench includes a first side wall along the second direction, and a second side wall opposite to the first side wall and parallel to the first side wall; the first trench runs through the mandrel material layer in the first region along the first direction or the first trench runs through the mandrel material layer in the first region along the first direction, and any one or both of the first side wall and the second side wall further extend into the mandrel material layer in the neighboring second region; and in the step of removing the mandrel layer, the second grooves are spaced apart.

In some implementations, in the step of forming the first trench, the first trench includes a first side wall along the second direction, and a second side wall opposite to the first side wall and parallel to the first side wall; the first side wall of the first trench is located in the first region, and there is a space between the first side wall and a boundary of the first region at the same side; the second side wall of the first trench is flush with a boundary of the first region at the same side, or the second side wall of the first trench is located in the neighboring second region; and in the step of removing the mandrel layer, the second grooves communicate with each other at the position of the first side wall.

In some implementations, in the step of forming the first trench, the first trench is located in the mandrel material layer in the first region and along the first direction, there is a space between the side wall of the first trench and a boundary of the first region at the same side; and in the step of removing the mandrel layer, the second grooves encircle the first groove.

In some implementations, the ion doping is performed on the mandrel material layer in the second region after the mandrel material layer is formed and before the first trench is formed; or the ion doping is performed on the mandrel material layer in the second region after the first trench is formed and before the spacers are formed; or the ion doping is performed on the mandrel material layer in the second region after the spacers are formed and before the mandrel layer is removed.

In some implementations, the material of the mandrel material layer includes one or more of amorphous silicon, polysilicon, silicon oxide, amorphous carbon, silicon nitride, amorphous germanium, silicon oxynitride, carbon nitride, silicon carbide, silicon carbonitride, and silicon oxycarbonitride.

In some implementations, ions for ion doping includes one or more of boron ions, phosphorus ions, and argon ions.

In some implementations, the ion doping is performed on the mandrel material layer in the second region using an ion implantation process.

In some implementations, the step of performing ion doping on the mandrel material layer in the second region includes: forming a shielding layer on the mandrel material layer in the first region, where the shielding layer exposes the second region;

performing ion doping on the mandrel material layer using the shielding layer as a mask; and removing the shielding layer.

In some implementations, the step of forming the first trench includes: forming a mask layer on the mandrel material layer, where the mask layer includes a mask opening extending along the first direction, where on a projection surface parallel to the base, the first region spans the mask opening along the second direction; removing the mandrel material layer below the mask opening using the mask layer as a mask, to form the first trench; and removing the mask layer.

In some implementations, the mandrel material layer below the mask opening is removed using a dry etching process and using the mask layer as a mask.

In some implementations, an etching selection ratio of the mandrel layer to the anti-etching layer is at least 20:1.

In some implementations, there is a plurality of first regions which are arranged along the second direction, the first regions of the plurality of first regions being separated from each other; and the semiconductor structure formation method further includes: forming, after the mandrel material layer is formed and before the spacers are formed, a second trench running through the mandrel material layer which is located along the second direction between the first regions, where in the step of forming the spacers, the spacers are further formed on side walls of the second trench, and the spacers on the side walls of the second trench form a third groove by encircling; and etching, using the anti-etching layer and the spacers as masks, the target layer below the first groove, the second grooves, and the third groove, to form the target pattern.

In some implementations, a process of removing the mandrel layer includes a wet etching process.

In some implementations, the target layer is a dielectric layer; and the target pattern is an interconnect trench; and the semiconductor structure formation method further includes: forming a metal interconnection line in the interconnect trench after the interconnect trench is formed.

The present disclosure further provide a mask used for forming a semiconductor structure. In one form, the semiconductor structure includes: a base, including a target layer used for forming a target pattern; and a mandrel material layer located on the base, the mandrel material layer including a first region used for forming a mandrel layer, and a second region encircling the first region and used for forming an anti-etching layer, where the etching resistance of the anti-etching layer is greater than the etching resistance of the mandrel layer; and the mask includes: a first mask, including a first pattern, where the first pattern is used for forming a first trench that runs through, along a first direction, at least part of the mandrel material layer in the first region, a direction perpendicular to the first direction being a second direction, and the first pattern is set to that part of the mandrel material layer in the first region remains at two sides of the first trench along the second direction; and a second mask, matching the first mask, where the second mask includes a second pattern, and the second pattern is used for forming the mandrel layer located in the first region.

In some implementations, the first trench includes a first side wall along the second direction, and a second side wall opposite to the first side wall and parallel to the first side wall; the first pattern is set to that the first trench runs through the mandrel material layer in the first region along the first direction; or the first trench runs through the mandrel material layer in the first region along the first direction, and any one or both of the first side wall and the second side wall further extend into the mandrel material layer in the neighboring second region.

In some implementations, the first trench includes a first side wall along the second direction, and a second side wall opposite to the first side wall and parallel to the first side wall; the first pattern is set to that the first side wall of the first trench is located in the first region, and there is a space between the first side wall and a boundary of the first region at the same side; and the second side wall of the first trench is flush with a boundary of the first region at the same side, or the second side wall of the first trench is located in the neighboring second region.

In some implementations, the first pattern is set to that the first trench is located in the mandrel material layer in the first region and along the first direction, there is a space between the side wall of the first trench and a boundary of the first region at the same side.

In some implementations, the first mask is used for forming a mask layer, the first trench being formed by etching the mandrel material layer using the mask layer as a mask; and the second mask is used for forming a shielding layer located in the first region, the anti-etching layer being formed by performing ion doping on the mandrel material layer in the second region using the shielding layer as a mask, the ion doping being suitable for increasing the etching resistance of the mandrel material layer, the mandrel material layer not doped with ions that is located in the first region serving as the mandrel layer.

Compared with the prior art, technical solutions of embodiments and implementations of the present disclosure have at least the following advantages.

In forms of the semiconductor structure formation method provided in the the present disclosure, the ion doping is performed on the mandrel material layer in the second region to form the anti-etching layer located in the second region and the mandrel layer located in the first region. In the step of forming the first trench, part of the mandrel material layer in the first region remains at two sides of the first trench along the second direction, that is to say, the first region spans the first trench along the second direction. Then the spacers are formed on the side walls of the first trench, so that the spacers form the first groove by encircling. In the step of removing the mandrel layer, the formed second grooves are correspondingly located at two sides of the first groove, and the first groove and the second groove are spaced apart by the spacer. In forms of the present disclosure, compared with the second groove, the first region is bigger in size, and therefore is easy to meet requirements of a photolithography process. Besides, the first region except an overlap between the first region and the first trench is used for defining the shape and size of the second groove, so that by using the overlap between the pattern of the first region and the pattern of the first trench, the second groove can be smaller in size. A space between the second groove and the first groove is defined by the thickness of the spacer. One can satisfy the design of the smallest space between the first groove and the second groove, facilitating, without changing limiting conditions of the photolithography process, implementation of a smaller critical dimension of the target pattern and further compression of a pitch between the target patterns, to meet requirements of the high density and high integration of an IC. Besides, with reasonable alteration on the existing process, the process is low in complexity and is highly friendly to the photolithography process.

DETAILED DESCRIPTION

It can be seen from the related art, as technological nodes become increasingly small, it becomes challenging to enable a pattern formed on a wafer to better match a target pattern.

To address the foregoing technical problems, embodiments and implementations of the present disclosure provide forms of a semiconductor structure formation method, in which ion doping is performed on a mandrel material layer in a second region to form an anti-etching layer located in the second region and a mandrel layer located in a first region. In a step of forming a first trench, part of the mandrel material layer in the first region remains at two sides of the first trench along a second direction, that is to say, the first region spans the first trench along the second direction. Then spacers are formed on side walls of the first trench, so that the spacers form a first groove by encircling it. In a step of removing the mandrel layer, formed second grooves are correspondingly located at two sides of the first groove, and the first groove and the second groove are spaced apart by the spacer. In forms of the present disclosure, compared with the second groove, the first region is bigger in size, and therefore provides the ability to meet requirements of a photolithography process. Besides, the first region except an overlap between the first region and the first trench is used for defining the shape and size of the second groove, so that by using the overlap between the pattern of the first region and the pattern of the first trench, the second groove can be smaller in size. A space between the second groove and the first groove is defined by the thickness of the spacer. One is able to satisfy the design of the smallest space between the first groove and the second groove, facilitating, without changing limiting conditions of the photolithography process, implementation of a smaller critical dimension of the target pattern and further compression of a pitch between the target patterns, to meet requirements of the high density and high integration of an IC. Besides, with reasonable alteration on the existing process, the process is low in complexity and is highly friendly to the photolithography process.

In order to make the foregoing objectives, features, and advantages of forms of the present disclosure more apparent and easier to understand, specific embodiments and implementations of the present disclosure are described in detail below with reference to the accompanying drawings. FIG. 1 to FIG. 12 are schematic structural diagrams corresponding to steps in one form of a semiconductor structure formation method according to the present disclosure.

Figure 1:
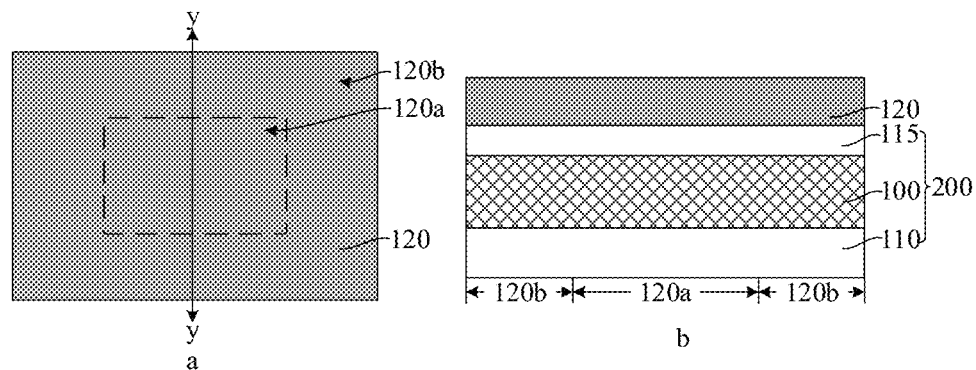
FIG. 1 to FIG. 12 are schematic structural diagrams corresponding to steps in one form of a semiconductor structure formation method.

Referring to FIG. 1, FIG. 1a is a top view, and FIG. 1b is a cross-sectional view of FIG. 1a taken along a line y-y. A base 200 is provided, including a target layer 100 used for forming a target pattern.

The base 200 is used for providing a platform for process procedures. The target layer 100 is a film layer that is to be patterned to form a target pattern. The target pattern may be a pattern such as a gate structure, an interconnect trench in a back end of line process, a fin part in a fin field effect transistor (FinFET), a channel stack in a gate-all-around (GAA) transistor or a forksheet transistor, or a hard mask (HM) layer.

In some implementations, the target layer 100 is a dielectric layer, and the target pattern is an interconnect trench. The dielectric layer is patterned subsequently to form a plurality of interconnect trenches. Then a metal interconnection line is formed in the interconnect trench. The dielectric layer is used for implementing electrical isolation between the metal interconnection lines. Therefore, the dielectric layer is an inter-metal dielectric (IMD) layer. The material of the dielectric layer is a low-k dielectric material, an ultra-low-k dielectric material, silicon oxide, silicon nitride, silicon oxynitride or the like.

Semiconductor devices such as a transistor and a capacitor may be formed in the base 200, and functional structures such as a resistance structure and a conductive structure may also be formed in the base 200. In some implementations, the base 200 further includes a substrate 110 located at the bottom of the target layer 100. In an example, the substrate 110 is a silicon substrate.

In some implementations, the base 200 further includes an HM material layer 115 located on the target layer 100.

Subsequently, the HM material layer 115 is first patterned to form an HM layer, and then the target layer 100 is patterned using the HM layer as a mask, improving the process stability of patterning the target layer 100 and the accuracy of pattern transfer.

The HM material layer 115 is made of a material that has etching selectivity with the target layer 100. The material of the HM material layer 115 includes one or more of titanium nitride, tungsten carbide, silicon oxide, silicon oxycarbide, and silicon oxycarbonitride. In an example, the material of the HM material layer 115 is titanium nitride.

In a specific process, according to actual process requirements, a stress buffer layer may be further disposed between the HM material layer 115 and the target layer 100. In addition, an etch stop layer may be further disposed between the HM material layer 115 and the stress buffer layer, and on the HM material layer 115. Relevant description about the stress buffer layer and the etch stop layer is not mentioned in this embodiment.

Still referring to FIG. 1, a mandrel material layer 120 is formed on the base 200. The mandrel material layer 120 includes a first region 120a used for forming a mandrel layer, and a second region 120b encircling the first region 120a and used for forming an anti-etching layer.

Subsequently, ion doping is performed on the mandrel material layer 120 in the second region 120b to form the anti-etching layer. The remaining mandrel material layer 120 located in the first region 120a serves as the mandrel layer.

The material of the mandrel material layer 120 includes one or more of amorphous silicon, polysilicon, silicon oxide, amorphous carbon, silicon nitride, amorphous germanium, silicon oxynitride, carbon nitride, silicon carbide, silicon carbonitride, and silicon oxycarbonitride. In some implementations, the material of the mandrel material layer 120 is amorphous silicon.

It should be noted that in some implementations, for convenience of illustration and description, merely one first region 120a is illustrated. However, the shape, position, and quantity of the first region 120a are not limited thereto. For example, in other implementations, there may be alternatively a plurality of first regions which are arranged along a second direction, the plurality of first regions being separated from each other.

Figure 2:
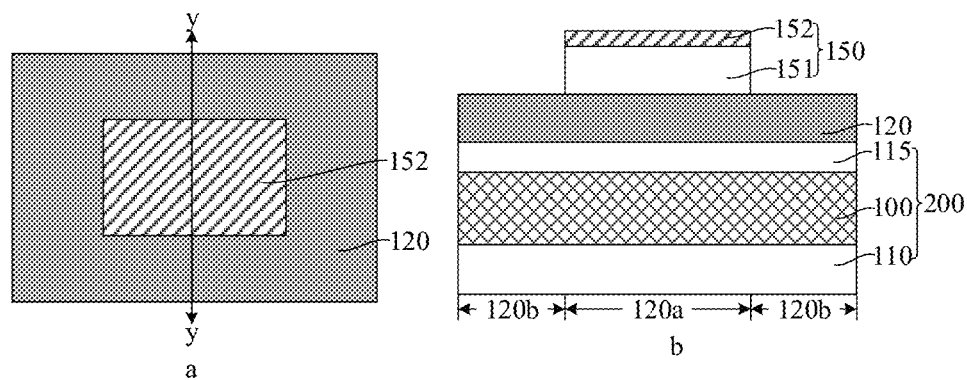
Figure 3:
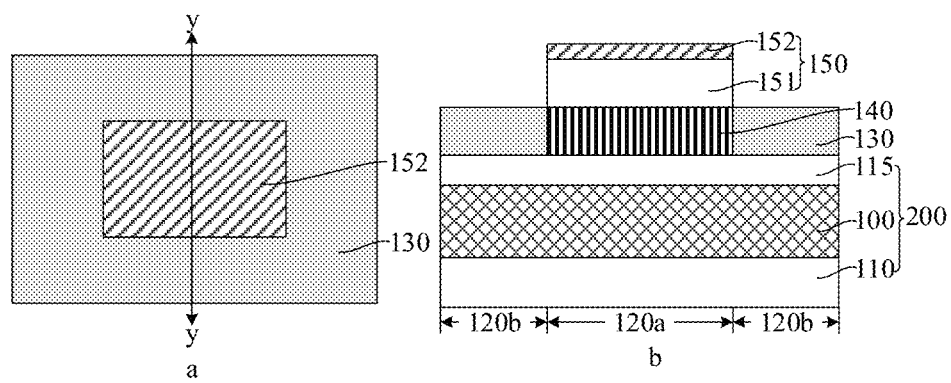
Figure 4:
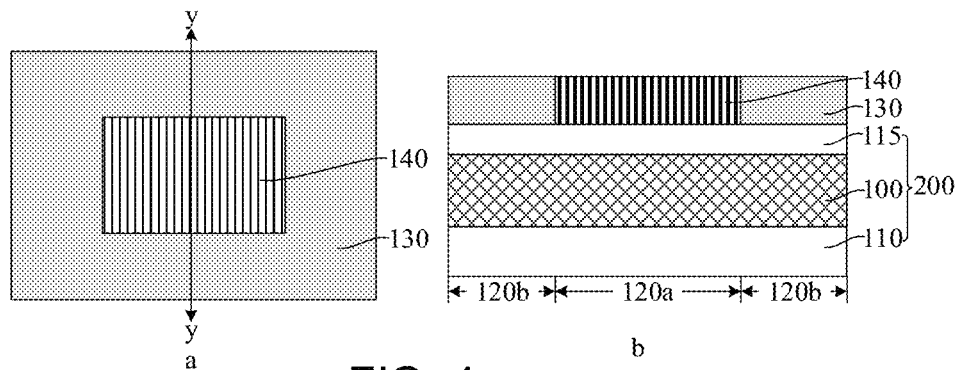

Referring to FIG. 2 to FIG. 4, ion doping is performed on the mandrel material layer 120 in the second region 120b, the ion doping being suitable for increasing the etching resistance of the mandrel material layer 120. The mandrel material layer 120 doped with ions that is located in the second region 120b serves as an anti-etching layer 130, and the mandrel material layer 120 not doped with ions that is located in the first region 120a serves as a mandrel layer 140.

After a first trench that runs through, along a first direction, at least part of the mandrel material layer 120 in the first region 120a is formed, the remaining mandrel material layer 120 (that is, the mandrel layer 140) in the first region 120a occupies a space for forming a second groove. The anti-etching layer 130 is used as a mask for subsequently patterning the target layer 100.

The subsequent manufacturing process further includes: forming spacers on side walls of the first trench, so that the spacers form a first groove by encircling.

In some implementations, the anti-etching layer 130 and the mandrel layer 140 are formed by performing ion doping on the mandrel material layer 120, to pattern the mandrel material layer 120. The ion doping is suitable for improving the etching resistance of the mandrel material layer 120, to enable the etching resistance of the anti-etching layer 130 to be greater than the etching resistance of the mandrel layer 140. There is a relatively high etching selection ratio of the mandrel layer 140 to the anti-etching layer 130, so that in a subsequent step of removing the mandrel layer 140 to form the second groove, it is not easy to mistakenly etch the anti-etching layer 130, reducing the probability of double etch performed on the first groove, and further ensuring the pattern precision of the first groove. Besides, the anti-etching layer 130 can be reserved as a mask for patterning the target layer 100.

In some implementations, the anti-etching layer 130 encircles the mandrel layer 140.

In some implementations, ions for ion doping performed on the mandrel material layer 120 in the second region 120b includes one or more of boron ions, phosphorus ions, and argon ions.

In some implementations, an etching selection ratio of the mandrel layer 140 to the anti-etching layer 130 is at least 20:1. There is a relatively high etching selection ratio of the mandrel layer 140 to the anti-etching layer 130, which helps conspicuously reduce the probability that the anti-etching layer 130 is mistakenly etched in the subsequent process of removing the mandrel layer 140.

In an example, the ion doping is performed on the mandrel material layer 120 in the second region 120b after the mandrel material layer 120 is formed and before the first trench is formed. However, steps of performing ion doping on the mandrel material layer 120 in the second region 120b are not limited thereto.

In other implementations, the ion doping is performed on the mandrel material layer in the second region after the first trench is formed and before the spacers are formed. In some other implementations, the ion doping is performed on the mandrel material layer in the second region after the spacers are formed and before the mandrel layer is removed.

In some implementations, the step of performing ion doping on the mandrel material layer 120 in the second region 120b includes:

As shown in FIG. 2, FIG. 2a is a top view, and FIG. 2b is a cross-sectional view of FIG. 2a taken along a line y-y. A shielding layer 150 is formed on the mandrel material layer 120 in the first region 120a. The shielding layer 150 exposes the second region 120b. The shielding layer 150 is used as a mask for performing ion doping on the mandrel material layer 120. The shielding layer 150 correspondingly defines the shapes and positions of the mandrel layer 140 and the anti-etching layer 130.

In some implementations, the shielding layer 150 includes a first planarization layer 151 and a first patterning layer 152.

The first planarization layer 151 is used for providing a planar surface for forming the first patterning layer 152, thereby improving the accuracy of pattern transfer. In some implementations, the material of the first planarization layer 151 is spin-on-carbon (SOC). The first patterning layer 152 is used as an etching mask for forming the first planarization layer 151. The first patterning layer 152 correspondingly defines the shapes and positions of the mandrel layer 140 and the anti-etching layer 130. In some implementations, the material of the first patterning layer 152 is a photoresist.

As shown in FIG. 3, FIG. 3a is a top view, and FIG. 3b is a cross-sectional view of FIG. 3a taken along a line y-y. By using the shielding layer 150 as a mask, ion doping is performed on the mandrel material layer 120. In some implementations, the ion doping is performed on the mandrel material layer 120 in the second region 120b by using an ion implantation process.

As shown in FIG. 4, FIG. 4a is a top view, and FIG. 4b is a cross-sectional view of FIG. 4a taken along a line y-y. The shielding layer 150 is removed. In some implementations, the shielding layer 150 is removed by using one or both of an ashing process and a wet photoresist stripping process.

Referring to FIG. 5 to FIG. 8, a first trench 180 that runs through, along a first direction (X direction shown in FIG. 7a), at least part of the mandrel material layer 120 in the first region 120a is formed. A direction perpendicular to the first direction is a second direction (Y direction shown in FIG. 7b). Part of the mandrel material layer 120 in the first region 120a remains at two sides of the first trench 180 along the second direction.

Part of the mandrel material layer 120 in the first region 120a remains at two sides of the first trench 180 along the second direction, that is to say, the first region 120a spans the first trench 180 along the second direction. Then, spacers are formed on side walls of the first trench 180. The spacers form a first groove by encircling it. In the subsequent step of removing the mandrel layer 140 to form second grooves, the second grooves are correspondingly located at two sides of the first groove, and the first groove and the second groove are spaced apart by the spacer.

In some implementations, compared with the second groove, the first region 120a is bigger in size, and therefore is easy to meet requirements of a photolithography process. Besides, the first region 120a except an overlap between the first region and the first trench 180 is used for defining the shape and size of the second groove, so that by using the overlap between the pattern of the first region 120a and the pattern of the first trench 180, the second groove can be smaller in size. A space between the second groove and the first groove is defined by the thickness of the spacer. It is easy to satisfy the design of the smallest space between the first groove and the second groove, facilitating, without changing limiting conditions of the photolithography process, implementation of a smaller critical dimension of the target pattern and further compression of a pitch between the target patterns, to meet requirements of the high density and high integration of an IC. Besides, with reasonable alteration on the existing process, the process is low in complexity and is highly friendly to the photolithography process.

In some implementations, after the ion doping is performed, the first trench 180 is formed. Therefore, the first trench 180 runs through, along the first direction, at least part of the mandrel layer 140, and along the second direction, part of the mandrel layer 140 remains at two sides of the first trench 180.

In some implementations, the first trench 180 includes a first side wall 181 along the second direction, and a second side wall 182 opposite to the first side wall 181 and parallel to the first side wall 181.

The first trench 180 runs through the mandrel material layer 120 in the first region 120a along the first direction; or the first trench 180 runs through the mandrel material layer 120 in the first region 120a along the first direction, and any one or both of the first side wall 181 and the second side wall 182 further extend into the mandrel material layer 120 in the neighboring second region 120b.

Therefore, in some implementations, after the first trench 180 is formed, the mandrel material layer 120 in the first region 120a located at two sides of the first trench 180 is spaced apart. Specifically, the mandrel layer 140 located at two sides of the first trench 180 is spaced apart. Therefore, after the mandrel layer 140 is removed subsequently, the formed second grooves are spaced apart.

In an example, the first trench 180 runs through the mandrel material layer 120 in the first region 120a along the first direction, and both the first side wall 181 and the second side wall 182 extend into the mandrel material layer 120 in the neighboring second region 120b. That is to say, along the first direction, an end part of the first trench 180 protrudes from the sacrificial layer, namely, the first region 120a. Subsequently, after the mandrel layer 140 is removed to form the second grooves, along the first direction, an end part of the first groove correspondingly protrudes from the second groove.

It should be noted that in some implementations, for convenience of illustration and description, merely one first region 120a, and the first trench 180 that runs through, along the first direction, at least part of the mandrel material layer 120 in the first region 120a are illustrated, and part of the mandrel material layer 120 in the first region 120a remains at two sides of the first trench 180 along the second direction. However, the shape, position, and quantity of the first region 120a and a positional relationship between the first region and the first trench 180 are not limited thereto.

In an example, there are a plurality of first regions which are arranged along the second direction, the plurality of first regions being separated from each other. The first trench may be formed in the mandrel material layer in some of the first regions, and the first trench may not be formed in the mandrel material layer in the remaining first regions. In other implementations, according to actual design requirements, the first trench may be formed in all of the first regions.

Figure 8:
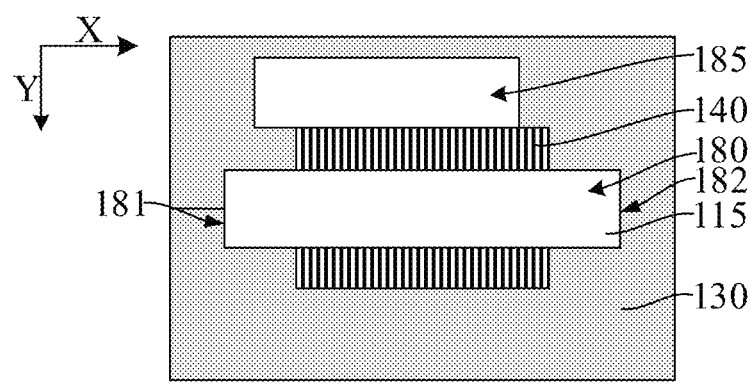

It should be further noted that in some implementations, for convenience of illustration and description, merely the first region 120a, the second region 120b, and the first trench 180 are illustrated, and other pattern structures around the first region 120a are not illustrated. It should be understood that, in an actual process, the first region 120a and the first trench 180 may not be independent patterns. According to design requirements, other pattern structures may be further disposed around the first region 120a. For example, as shown in FIG. 8, a second trench 185 may be further formed at one or two sides of the first region 120a along the second direction. In the subsequent step of forming the spacers on the side walls of the first trench 180, spacers are also formed on side walls of the second trench 185. The spacers on the side walls of the second trench 185 can form a third groove by encircling. The third groove is also used for correspondingly defining the pattern of the target pattern.

Figure 5:
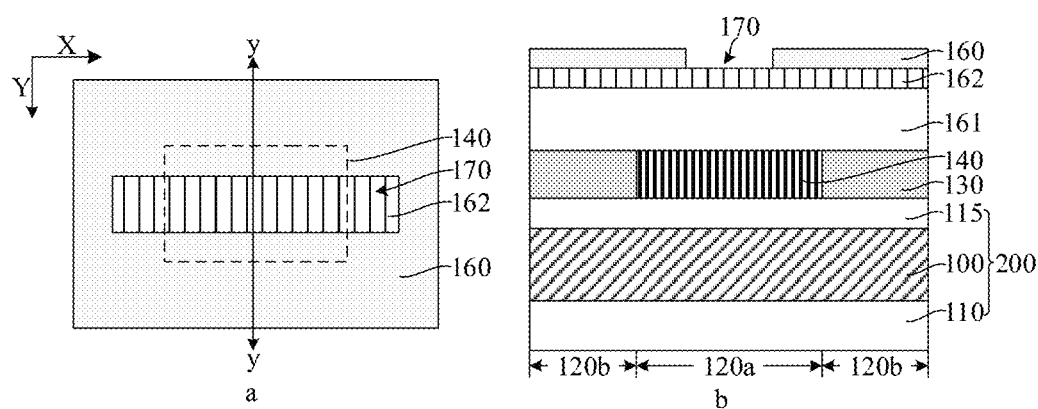

In some implementations, the step of forming the first trench 180 includes:

As shown in FIG. 5, FIG. 5a is a top view, and FIG. 5b is a cross-sectional view of FIG. 5a taken along a line y-y. A mask layer 160 is formed on the mandrel material layer 120. The mask layer 160 includes a mask opening 170 extending along a first direction (X direction shown in FIG. 5a). On a projection surface parallel to the base 200, the first region 120a spans the mask opening 170 along a second direction (Y direction shown in FIG. 5b).

The mask layer 160 is used as an etching mask for forming the first trench. The mask opening 170 is used for defining the shape and position of the first trench. In some implementations, the material of the mask layer 160 is a photoresist.

In some implementations, before the mask layer 160 is formed, the formation method further includes: forming a second planarization layer 161 on the mandrel material layer 120; and forming an anti-reflective coating 162 on the second planarization layer 161.

The second planarization layer 161 is used for providing a planar top surface for forming the mask layer 160. In some implementations, the material of the second planarization layer 161 is SOC.

The anti-reflective coating 162 is used for reducing the reflection effect at the time of exposure. In some implementations, the material of the anti-reflective coating 162 is a bottom anti-reflective coating (BARC).

Figure 6:
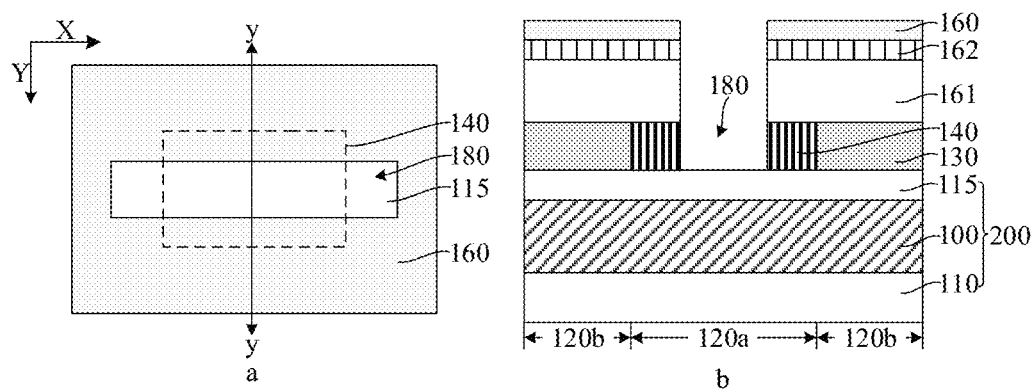

As shown in FIG. 6, FIG. 6a is a top view, and FIG. 6b is a cross-sectional view of FIG. 6a taken along a line y-y. By using the mask layer 160 as a mask, the mandrel material layer 120 below the mask opening 170 is removed, to form the first trench 180.

In some implementations, by using the mask layer 160 as a mask, the mandrel material layer 120 below the mask opening 170 is removed by using a dry etching process (such as an anisotropic dry etching process), thereby improving the accuracy of pattern transfer and the cross-sectional morphology quality of the first trench 180.

Figure 7:
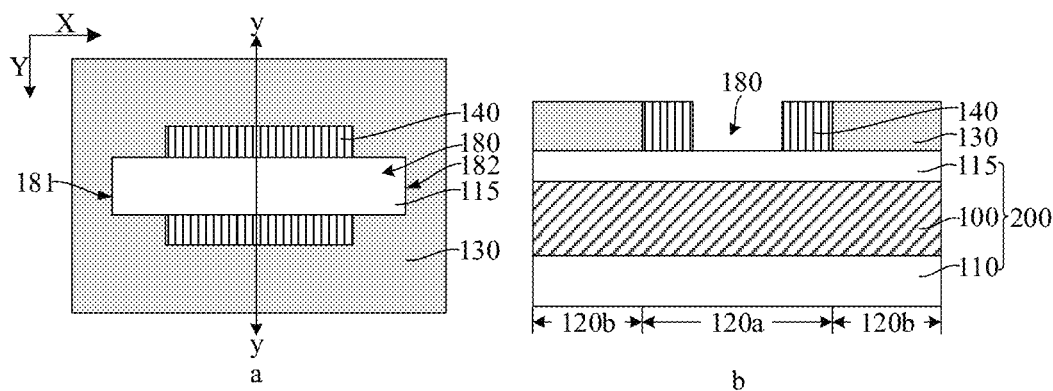

As shown in FIG. 7, FIG. 7a is a top view, and FIG. 7b is a cross-sectional view of FIG. 7a taken along a line y-y. The mask layer 160 is removed. In some implementations, the mask layer 160 is removed using one or both of an ashing process and a wet photoresist stripping process.

Figure 9:
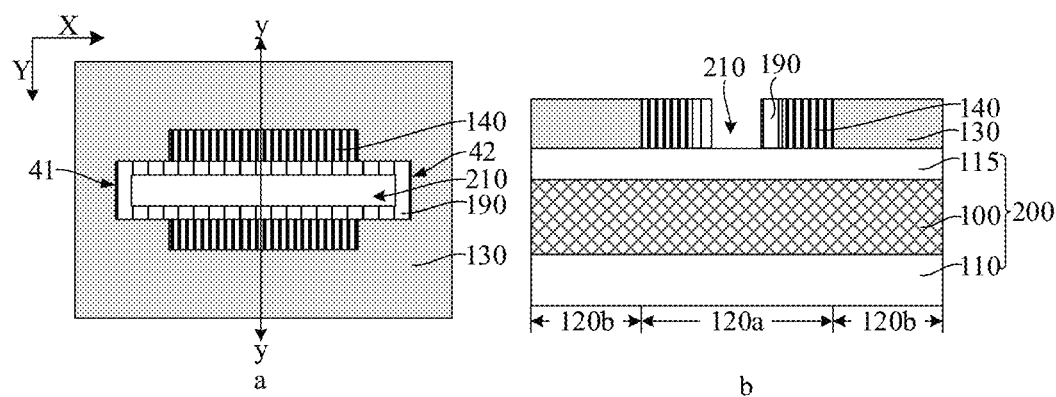

In the step of removing the mask layer 160, the anti-reflective coating 162 and the second planarization layer 161 are further removed. Referring to FIG. 9, FIG. 9a is a top view, and FIG. 9b is a cross-sectional view of FIG. 9a taken along a line y-y. Spacers 190 are formed on side walls of the first trench 180, so that the spacers 190 form a first groove 210 by encircling it.

The first groove 210 is used for defining a partial pattern of the target pattern. In some implementations, the first trench 180 and the spacers 190 are used to define the shape and position of the first groove 210, helping enable the first groove 210 to be smaller in size. The first groove 210 and the mandrel layer 120 are spaced apart by the spacers 190.

The spacers 190 are made of a material that has etching selectivity with the mandrel layer 140, the anti-etching layer 130, and the target layer 100. The material of the spacers 190 includes one or more of titanium oxide, silicon oxide, silicon nitride, silicon carbide, silicon oxycarbide, aluminum oxide, and amorphous silicon.

In some implementations, the step of forming the spacers 190 includes: forming a spacer material layer (not shown in the figure) conformally covering a top surface of the mandrel layer 140 and the anti-etching layer 130, and the bottom and side walls of the first trench 180; and removing the spacer material layer on the top surface of the mandrel layer 140 and the anti-etching layer 130, and at the bottom of the first trench 180, where the remaining spacer material layer on the side walls of the first trench 180 is used as the spacers 190.

In some implementations, the spacer material layer is formed by using an atomic layer deposition process, improving the thickness uniformity of the spacer material layer, and being easy to precisely control the thickness of the spacer material layer.

In some implementations, the spacer material layer on the top surface of the mandrel layer 140 and the anti-etching layer 130, and at the bottom of the first trench 180 is removed using the dry etching process (such as the anisotropic dry etching process).

Figure 10:
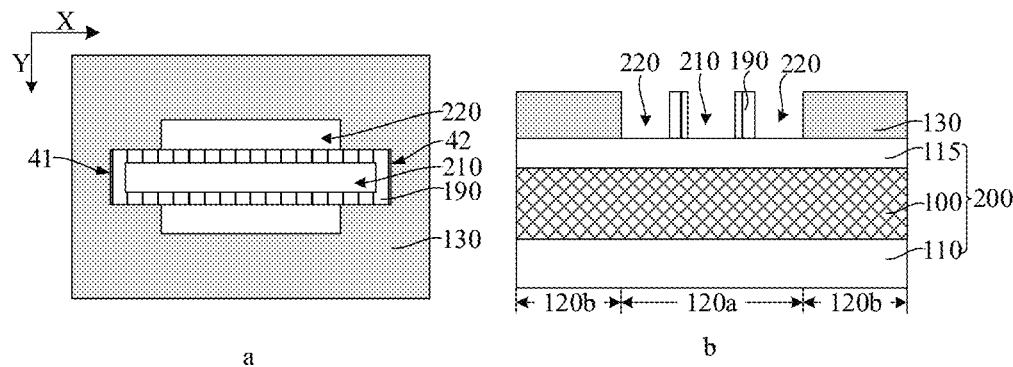

Referring to FIG. 10, FIG. 10a is a top view, and FIG. 10b is a cross-sectional view of FIG. 10a taken along a line y-y. The mandrel layer 140 is removed after the ion doping is performed and the spacers 190 are formed. Second grooves 220 located at two sides of the first groove 210 are formed in the anti-etching layer 130.

The second grooves 220 and the first groove 210 jointly define the pattern of the target pattern.

After the mandrel layer 140 is removed, the second groove 220 and the first groove 210 are spaced apart by the spacer 190, satisfying the design of the smallest space between the second groove 220 and the first groove 210.

In some implementations, there is a relatively high etching selection ratio of the mandrel layer 140 to the anti-etching layer 130, so that in the step of removing the mandrel layer 140 to form the second grooves 220, it is not easy to cause double etch on the first groove 210. Therefore, the risk of the process is reduced correspondingly, and the pattern precision of the first groove 210 is ensured.

In some implementations, after the second grooves 220 are formed, an end part of the first groove 210 protrudes from the second grooves 220 along the first direction. The second grooves 220 are located at two sides of the first groove 210, and the second grooves 220 are spaced apart.

The process of removing the mandrel layer 140 includes one or both of a wet etching process and the dry etching process. In an example, the mandrel layer 140 is removed by using the wet etching process. In some implementations, the etching solution in the wet etching process includes a tetramethylammonium hydroxide (TMAH) solution, an SC1 solution, or an SC2 solution. The SC1 solution refers to a mixed solution of $NH_4OH$ and $H_2O_2$. The SC2 solution refers to a mixed solution of HCl and $H_2O_2$.

Figure 11:
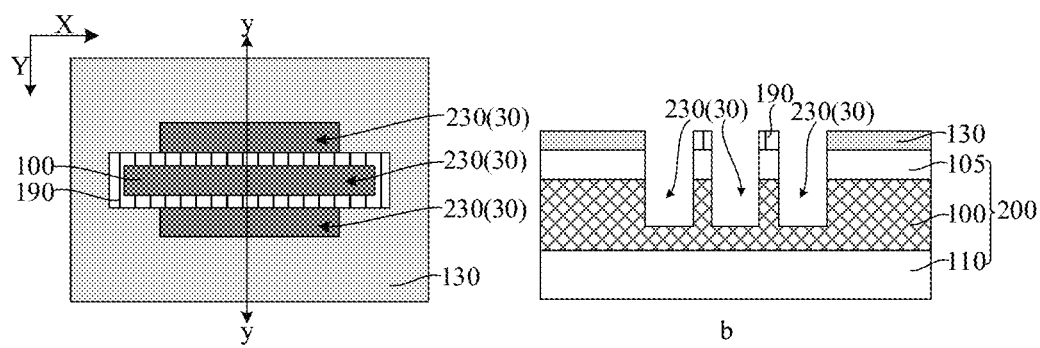

Referring to FIG. 11, FIG. 11a is a top view, and FIG. 11b is a cross-sectional view of FIG. 11a taken along a line y-y. The target layer 100 below the first groove 210 and the second grooves 220 is etched by using the anti-etching layer 130 and spacers 190 as masks, to form a target pattern 230.

As described above, patterns of the second grooves 220 are defined by using the overlap between the pattern of the first region 120a and the pattern of the first trench 180, so that the second grooves 220 can be smaller in size, and it is easy to satisfy the design of the smallest space between the second groove 220 and the first groove 210, facilitating, without changing limiting conditions of the photolithography process, implementation of a smaller critical dimension of the target pattern 230 and further compression of a pitch between the target patterns 230, to meet requirements of the high density and high integration of an IC. Besides, with reasonable alteration on the existing process, the process is low in complexity and is highly friendly to the photolithography process, improving the matching degree between the target pattern 230 and a designed pattern, and improving the pattern precision of the target pattern 230.

In some implementations, the target layer 100 is a dielectric layer. Therefore, the dielectric layer below the first groove 210 and the second grooves 220 is etched by using the anti-etching layer 130 and the spacers 190 as masks, to form an interconnect trench 30. The target pattern 230 is the interconnect trench 30. The interconnect trench 30 is used for providing a space for forming metal interconnection lines.

Specifically, in some implementations, the HM material layer 115 below the first groove 210 and the second grooves 220 is etched using the anti-etching layer 130 and spacers 190 as masks, to form an HM layer 105; and the dielectric layer is patterned by using the HM layer 105 as a mask, to form the interconnect trench 30.

In some implementations, in the step of etching the target layer 100 below the first groove 210 and the second grooves 220, a partial thickness of the anti-etching layer 130 and the spacers 190 is also consumed.

Figure 12:
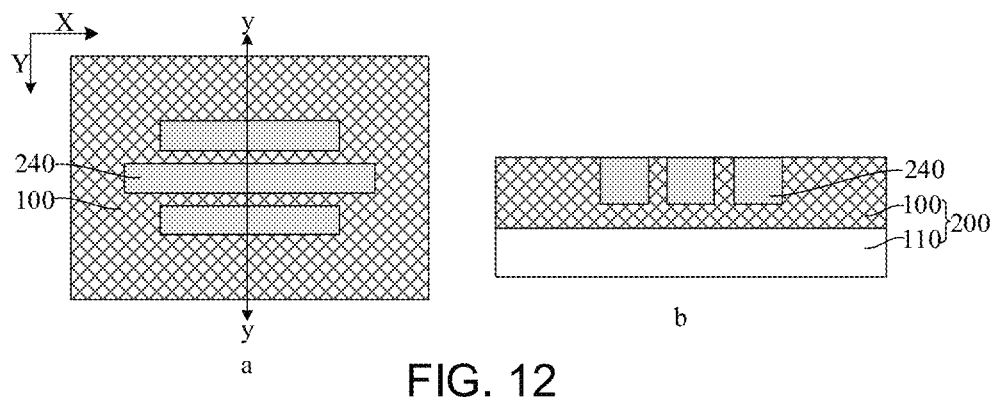

As shown in FIG. 12, FIG. 12a is a top view, and FIG. 12b is a cross-sectional view of FIG. 12a taken along a line y-y. The formation method further includes: forming a metal interconnection line 240 in the interconnect trench 30 after the interconnect trench 30 is formed.

In some implementations, the interconnect trench 30 can be smaller in a critical dimension, and a pitch between the interconnect trenches 30 is further compressed, thereby facilitating further compression of a pitch between the metal interconnection lines 240, to meet requirements of the high density and high integration of an IC. Besides, one can satisfy the design of the smallest space between the interconnect trenches 30, and the pattern precision of the interconnect trench 30 is relatively high, thereby correspondingly satisfying the design of the smallest space between the metal interconnection lines 240 and improving the pattern precision of the metal interconnection lines 240, to improve the performance of the semiconductor structure.

The metal interconnection line 240 is used for implementing the electrical connection between the semiconductor structure and an external circuit or other interconnection structures. In some implementations, the material of the metal interconnection line 240 is copper. In other embodiments, the material of the metal interconnection line may alternatively be a conductive material such as cobalt, tungsten, or aluminum. In some implementations, in the step of forming the metal interconnection line 240, the anti-etching layer 130, the spacers 190, and the HM layer 105 are further removed for preparation of the subsequent manufacturing process.

Figure 13:
FIG. 13 to FIG. 16 are top views corresponding to steps in another form of a semiconductor structure formation method.

FIG. 13 to FIG. 16 are top views corresponding to steps in another form of a semiconductor structure formation method. The similarities between this form and the aforementioned forms are omitted here. A difference between this forms and the above forms lies in:

Referring to FIG. 13, ion doping is performed on the mandrel material layer (no shown in the figure) in the second region (not shown in the figure), the ion doping being suitable for increasing the etching resistance of the mandrel material layer. The mandrel material layer doped with ions that is located in the second region serves as the anti-etching layer 330, and the mandrel material layer not doped with ions that is located in the first region serves as the mandrel layer 340.

In an example, before the first trench is formed, the ion doping is performed.

Figure 14:
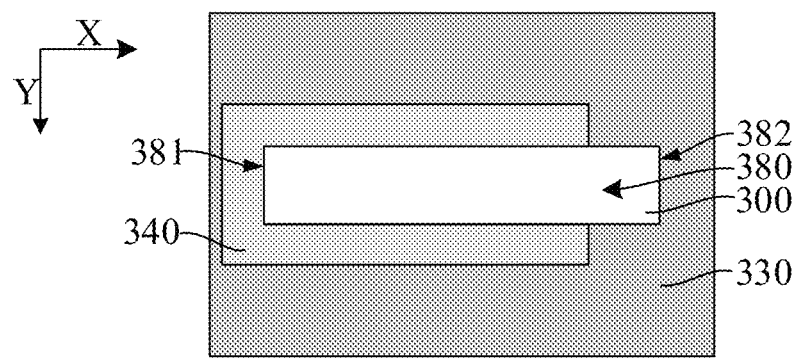

Referring to FIG. 14, a first trench 380 that runs through, along a first direction (X direction shown in FIG. 14) at least part of the mandrel material layer in the first region. A direction perpendicular to the first direction is a second direction (Y direction shown in FIG. 14). Part of the mandrel material layer in the first region remains at two sides of the first trench 380 along the second direction.

In some implementations, the first trench 380 is formed after the ion doping is performed. Therefore, the first trench 380 runs through, along the first direction, at least part of the mandrel layer 340, and along the second direction, part of the mandrel layer 340 remains at two sides of the first trench 380.

The first trench 380 includes a first side wall 381 along the second direction, and a second side wall 382 opposite to the first side wall 381 and parallel to the first side wall 381. In some implementations, the first side wall 381 of the first trench 380 is located in the first region, and there is a space between the first side wall 381 and a boundary of the first region at the same side; and the second side wall 382 of the first trench 380 is flush with a boundary of the first region at the same side, or the second side wall 382 of the first trench 380 is located in the neighboring second region.

Specifically, in this implementation, the first side wall 381 of the first trench 380 is located in the mandrel layer 340, and there is a space between the first side wall 381 and a side wall of the mandrel layer 340 at the same side.

Additionally, the second side wall 382 of the first trench 380 is flush with a side wall of the mandrel layer 340 at the same side, or the second side wall 382 of the first trench 380 is located in the neighboring anti-etching layer 330.

In an example, the first side wall 381 of the first trench 380 is located in the mandrel layer 340, and there is a space between the first side wall 381 and a side wall of the mandrel layer 340 at the same side. The second side wall 382 of the first trench 380 is located in the neighboring anti-etching layer 330.

Figure 15:
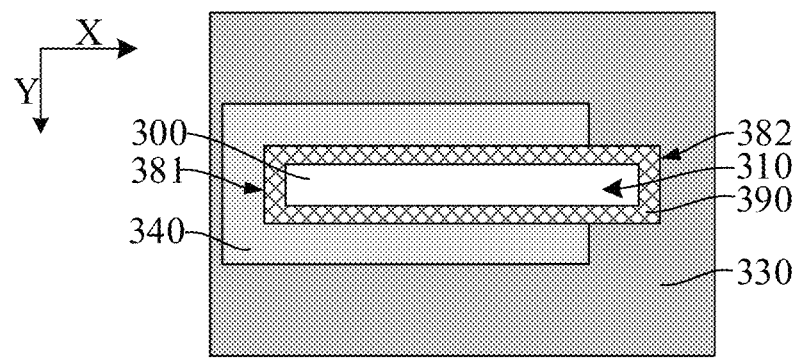

Referring to FIG. 15, spacers 390 are formed on side walls of the first trench 380, so that the spacers 390 form a first groove 310 by encircling it.

Figure 16:
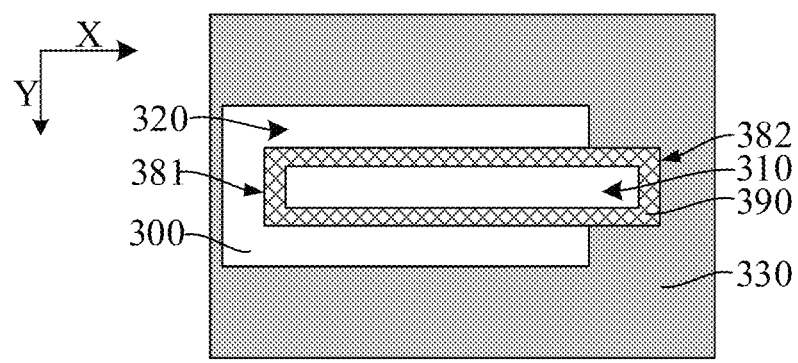

Referring to FIG. 16, the mandrel layer 340 is removed after the ion doping is performed and the spacers 390 are formed, and second grooves 320 located at two sides of the first groove 310 are formed in the anti-etching layer 330.

In the step of removing the mandrel layer 340, the second grooves 320 communicate with each other at the position of the first side wall 381. The second groove 320 correspondingly exposes a side wall of the first side wall 381.

Therefore, in this implementation, the second groove 320 not only extends along the first direction, but also the second groove 320 outside the first side wall 381 extends along the second direction, so that an overlap between the pattern of the mandrel layer 340 and the pattern of the first trench 380 is used to enable the pattern of the second groove 320 to be a two-dimensional pattern, improving the design freedom of the target pattern. Besides, compared with a process in which a two-dimensional pattern is implemented using a pattern of a mask, the process difficulty is reduced and the photolithography process window is enlarged in this form.

In some implementations, a target layer is a dielectric layer. Subsequently, the dielectric layer below the first groove 310 and the second groove 320 is etched using the anti-etching layer 330 and the spacer 390 as masks, to form an interconnect trench. The interconnect trench is used for providing a space for forming metal interconnection lines. Correspondingly, the metal interconnection line corresponding to the position of the second groove 320 not only extends along the first direction, but also extends along the second direction, to implement two-dimensional winding, thereby improving the freedom of pattern design and layout of the metal interconnection line, and improving the connection capability of the metal interconnection line.

For detailed descriptions of the semiconductor structure formation method in this form, reference may be made to corresponding descriptions in the foregoing forms, as details are not described herein again.

Figure 17:
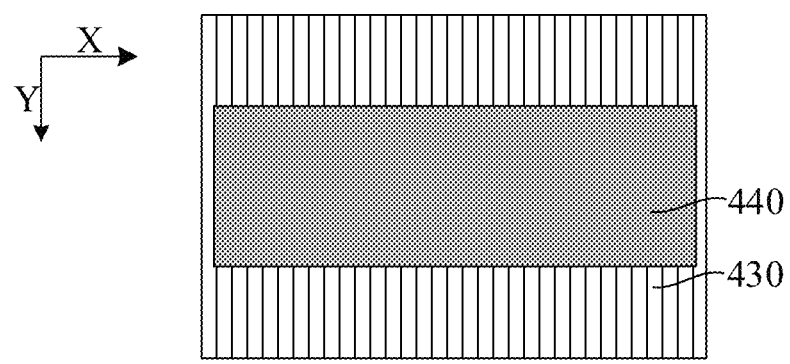
FIG. 17 to FIG. 20 are top views corresponding to steps in yet another form of a semiconductor structure formation method.

FIG. 17 to FIG. 20 are top views corresponding to steps in yet another form of a semiconductor structure formation method. The similarities between this form and the aforementioned forms are omitted here. A difference between this form and the above forms lies in:

Referring to FIG. 17, ion doping is performed on the mandrel material layer in the second region, the ion doping being suitable for increasing the etching resistance of the mandrel material layer. The mandrel material layer doped with ions that is located in the second region serves as the anti-etching layer 430, and the mandrel material layer not doped with ions that is located in the first region serves as the mandrel layer 440.

In an example, before the first trench is formed, the ion doping is performed.

Figure 18:
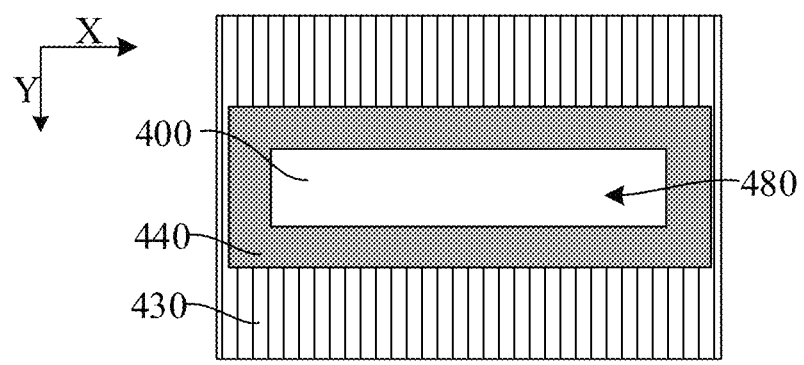

Referring to FIG. 18, a first trench 480 that runs through, along a first direction, at least part of the mandrel material layer in the first region is formed. A direction perpendicular to the first direction is a second direction. Part of the mandrel material layer in the first region remains at two sides of the first trench 480 along the second direction.

The first trench 480 is located in the mandrel material layer in the first region and along the first direction, there is a space between a side wall of the first trench 480 and a boundary of the first region at the same side.

Specifically, the first trench 480 is located in the mandrel layer 440, and there is a space along the first direction between the side wall of the first trench 480 and a side wall of the mandrel layer 440 at the same side. Besides, along the second direction, part of the mandrel material layer in the first region remains at two sides of the first trench 480, that is to say, along the second direction, there is also a space between a side wall of the first trench 480 and a side wall of the mandrel layer 440 at the same side.

Therefore, in some implementations, after the first trench 480 is formed, the remaining mandrel layer 440 encircles the first trench 480.

Figure 19:
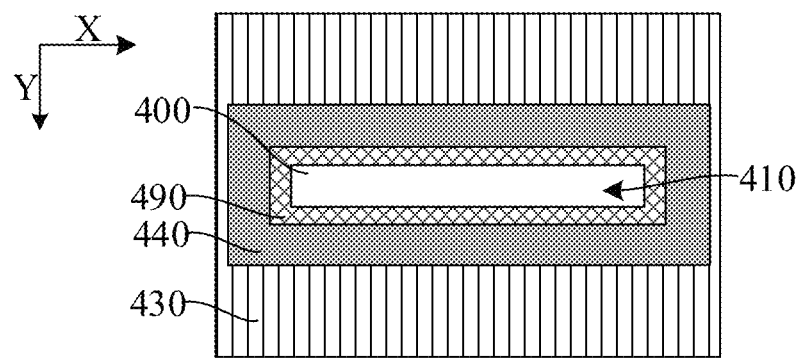

Referring to FIG. 19, spacers 490 are formed on side walls of the first trench 480, so that the spacers 490 form a first groove 410 by encircling it.

Figure 20:
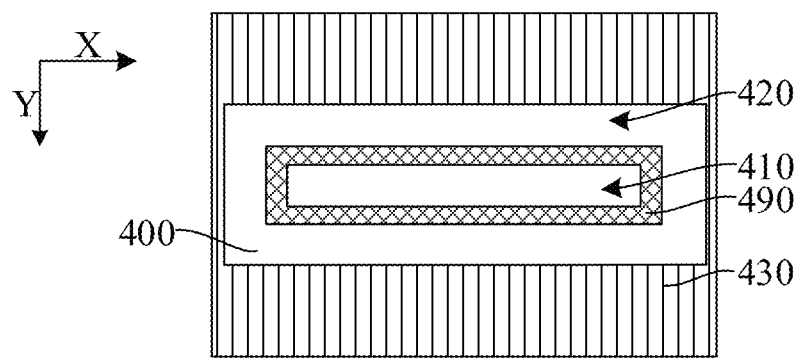

Referring to FIG. 20, the mandrel layer 440 is removed after the ion doping is performed and the spacers 490 are formed, and second grooves 420 located at two sides of the first groove 410 are formed in the anti-etching layer 430.

In some implementations, in the step of removing the mandrel layer 440, the second groove 420 encircles the first groove 410. The second groove 420 correspondingly encircles side walls of the spacers 490. The second groove 420 is an annular groove.

Therefore, in this implementation, the second groove 420 not only extends along the first direction, but also extends along the second direction, so that an overlap between the pattern of the mandrel layer 440 and the pattern of the first trench 480 is used to enable the pattern of the second groove 420 to be a two-dimensional pattern, improving the design freedom of the target pattern. Besides, compared with a process in which a two-dimensional pattern is implemented by using a pattern of a mask, the process difficulty is reduced and the photolithography process window is enlarged in this embodiment.

In some implementations, a target layer (not shown in the figure) is a dielectric layer. Subsequently, the dielectric layer below the first groove 410 and the second groove 420 is etched using the anti-etching layer 430 and the spacer 490 as masks, to form an interconnect trench. The interconnect trench is used for providing a space for forming metal interconnection lines.

Correspondingly, the metal interconnection line corresponding to the position of the second groove 420 not only extends along the first direction, but also extends along the second direction, to implement two-dimensional winding, thereby improving the freedom of pattern design and layout of the metal interconnection line and improving the connection capability of the metal interconnection line.

For detailed descriptions of the semiconductor structure formation method in this form, reference may be made to corresponding descriptions in the foregoing forms as details are not described herein again.

Figure 21:
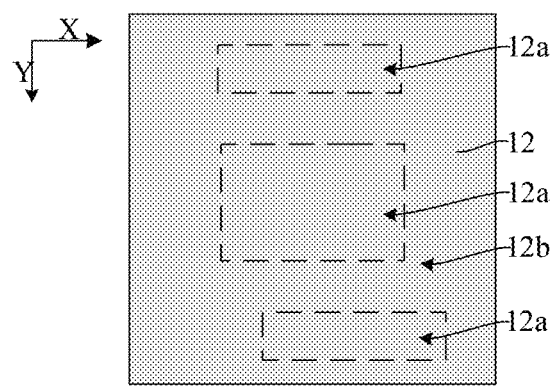
FIG. 21 to FIG. 25 are top views corresponding to steps in still another form of a semiconductor structure formation method.

FIG. 21 to FIG. 25 are top views corresponding to steps in still another form of a semiconductor structure formation method. The similarities between this form and the aforementioned forms are omitted here. A difference between this form and the above forms lies in:

As shown in FIG. 21, a mandrel material layer 12 is formed on the base. The mandrel material layer 12 includes a first region 12*a* used for forming a mandrel layer, and a second region 12*b* encircling the first region 12*a* and used for forming an anti-etching layer. There is a plurality of first regions 12*a* which are arranged along the second direction, where the first regions of the plurality of first regions 12*a* are separated from each other.

It should be noted that the shape, position, layout, and quantity of the first regions 12*a* are merely illustrated as an example in this form. The shape, position, quantity, and layout of the first regions 12*a* are not limited thereto in this form of the present disclosure.

Figure 22:
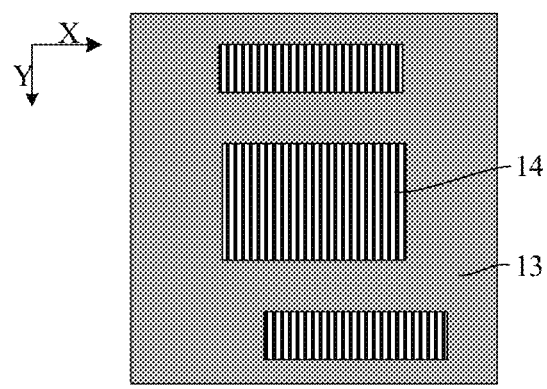

As shown in FIG. 22, ion doping is performed on the mandrel material layer 12 in the second region 12*b*, the ion doping being suitable for increasing the etching resistance of the mandrel material layer 12. The mandrel material layer 12 doped with ions that is located in the second region 12*b* serves as an anti-etching layer 13, and the mandrel material layer 12 not doped with ions that is located in the first region 12*a* serves as a mandrel layer 14.

Figure 23:
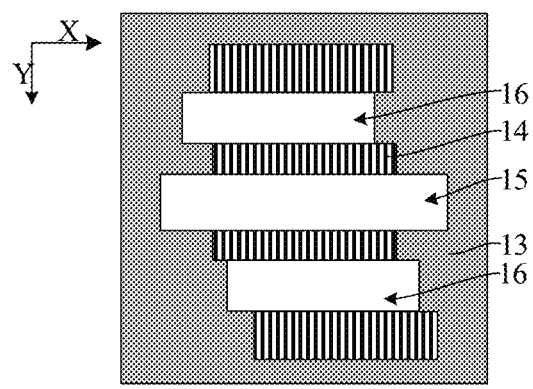

As shown in FIG. 23, a first trench 15 that runs through, along a first direction, at least part of the mandrel material layer 12 in the first region 12*a* is formed. A direction perpendicular to the first direction is a second direction. Part of the mandrel material layer 12 in the first region 12*a* remains at two sides of the first trench 15 along the second direction.

In an example, after the ion doping is performed, the first trench 15 is formed. Correspondingly, the first trench 15 runs through, along the first direction, at least part of the mandrel layer 14, and along the second direction, part of the anti-etching layer 13 remains at two sides of the first trench 15.

In an example, the first trench 15 may be formed in the mandrel material layer 12 in some of the first regions 12*a*, and the first trench 15 may not be formed in the mandrel material layer 12 in the remaining first regions 12*a*.

In another form, according to actual design requirements, the first trench may be formed in all of the first regions.

As shown in FIG. 23, the semiconductor structure formation method further includes: forming, after the mandrel material layer 12 is formed and before spacers are formed, a second trench 16 running through the mandrel material layer 12 which is located along the second direction between the first regions 12*a*.

In an example, after the ion doping is performed, the second trench 16 is formed. Correspondingly, the second trench 16 runs through the anti-etching layer 13 located along the second direction between the mandrel layers 14.

It should be noted that the second trench 16 and the first trench 15 may be formed in the same step or in different steps. Specific steps for forming the first trench 15 and the second trench 16 are not limited in this form.

Figure 24:
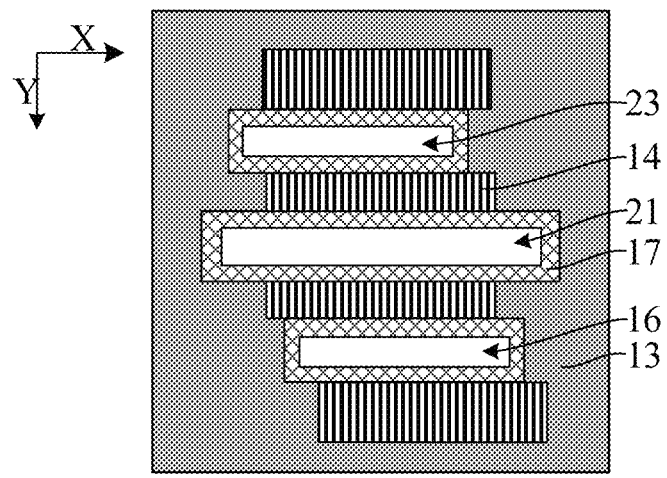

As shown in FIG. 24, spacers 17 are formed on side walls of the first trench 15, so that the spacers 17 form a first groove 21 by encircling.

In some implementations, in the step of forming the spacers 17, the spacers 17 are further formed on side walls of the second trench 16, and the spacers 17 on the side walls of the second trench 16 form a third groove 23 by encircling.

Correspondingly, the mandrel layer 14 is removed subsequently to form a second groove. The second groove, the first groove 21, and the third groove 23 are arranged along the second direction, and adjacent grooves are spaced apart by the spacer 17. The third groove 23 is also used for defining the pattern of a target pattern correspondingly.

Figure 25:
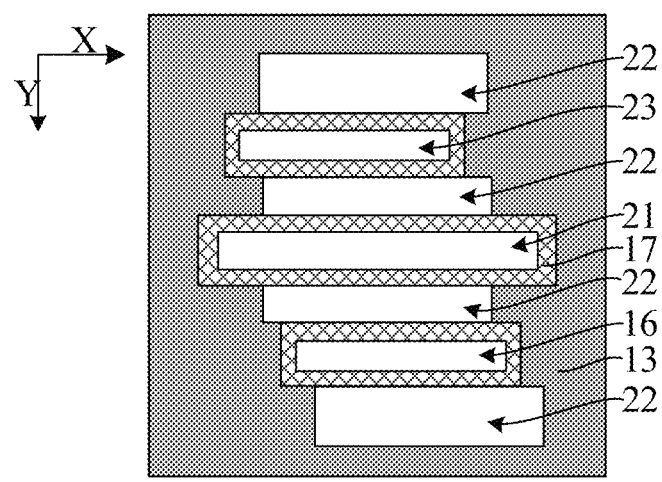

As shown in FIG. 25, the mandrel layer 14 is removed, and second grooves 22 located at two sides of the first groove 21 are formed in the anti-etching layer 13.

The first groove 21, the second grooves 22, and the third groove 23 are used for jointly defining the pattern of the target pattern.

Correspondingly, a target layer below the first groove 21, the second grooves 22, and the third groove 23 is etched subsequently using the anti-etching layer 13 and spacers 17 as masks, to form the target pattern.

For detailed descriptions of the semiconductor structure formation method in this form, reference may be made to corresponding descriptions in the foregoing forms as details are not described herein again.

Figure 26:
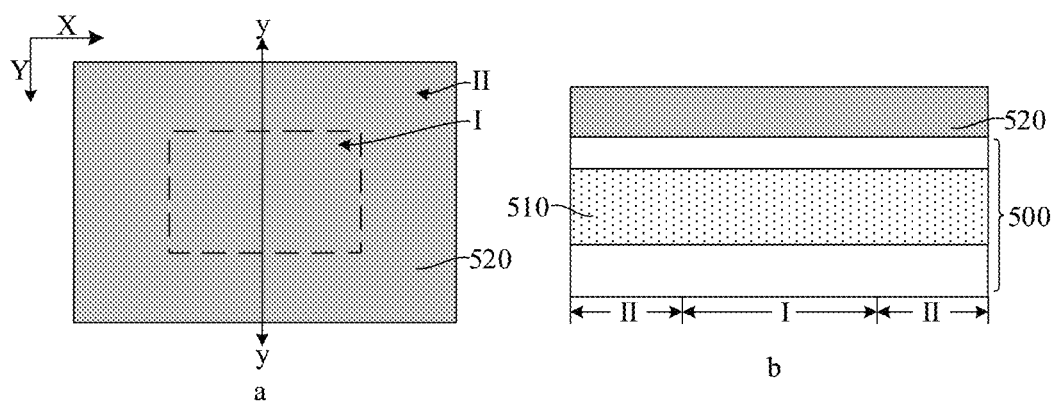
FIG. 26 is a schematic structural diagram of one form of a semiconductor structure treated without using a mask.
Figure 27:
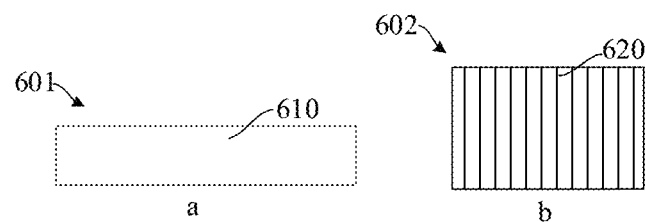
FIG. 27 is a schematic structural diagram of one form of a mask.
Figure 28:
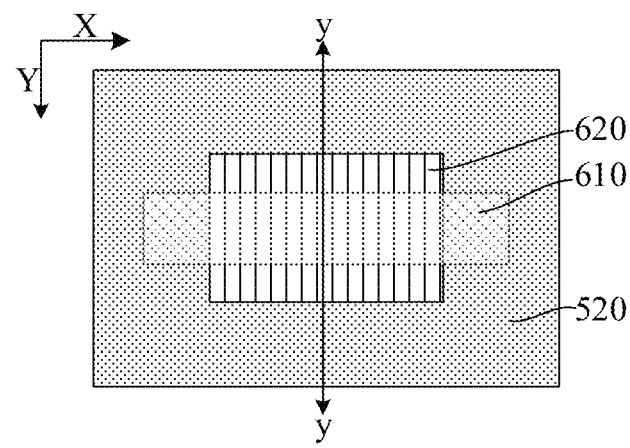
FIG. 28 is a schematic diagram of treating a semiconductor structure using the mask in FIG. 27.

The present disclosure further provides forms of a mask, used for forming a semiconductor structure. FIG. 26 is a schematic structural diagram of one form of a semiconductor structure treated without using a mask. FIG. 27 is a schematic structural diagram of one form of a mask. FIG. 28 is a schematic structural diagram of treating a semiconductor structure using the mask in FIG. 27. FIG. 27*a* is a schematic diagram of one form of a first mask 601. FIG. 27*b* is a schematic diagram of one form of a second mask 602.

As shown in FIG. 26, FIG. 26*a* is a top view, and FIG. 26*b* is a cross-sectional view of FIG. 26*a* taken along a line y-y. The semiconductor structure includes: a base 500, including a target layer 510 used for forming a target pattern; and a mandrel material layer 520 located on the base 500, the mandrel material layer including a first region I used for forming a mandrel layer, and a second region II encircling the first region I and used for forming an anti-etching layer, where the etching resistance of the anti-etching layer is greater than the etching resistance of the mandrel layer.

The target layer 510 is a film layer that is to be patterned to form a target pattern. The target pattern may be a pattern such as a gate structure, an interconnect trench in a back end of line process, a fin part in a FinFET, a channel stack in a GAA transistor or a forksheet transistor, or an HM layer.

In some implementations, the target layer 510 is a dielectric layer, and the target pattern is an interconnect trench. The interconnect trench provides a space for forming metal interconnection lines, and the dielectric layer correspondingly implements electrical isolation between the metal interconnection lines.

The etching resistance of the anti-etching layer is greater than the etching resistance of the mandrel layer. After the semiconductor structure is treated using the mask in this implementation, the remaining anti-etching layer is used as a mask for patterning the target layer 510. Subsequently, the mandrel layer needs to be removed to form a corresponding groove. The groove is used for defining a partial pattern of the target pattern.

Referring to FIG. 27 and FIG. 28, the mask includes: the first mask 601, including a first pattern 610, where the first pattern 610 is used for forming a first trench that runs through, along a first direction (X direction shown in FIG. 28) at least part of the mandrel material layer 520 in the first region I, a direction perpendicular to the first direction being a second direction (Y direction shown in FIG. 28), and the first pattern 610 is set to that part of the mandrel material layer in the first region I remains at two sides of the first trench along the second direction; and the second mask 602, matching the first mask 601, where the second mask 602 includes a second pattern 620, and the second pattern 620 is used for forming the mandrel layer located in the first region I.

The first pattern 610 is set to that part of the mandrel material layer in the first region I remains at two sides of the first trench along the second direction. The second pattern 620 is used for forming the mandrel layer located in the first region I. Therefore, after the semiconductor structure is treated using the mask provided in this implementation, the pattern of the mandrel layer spans the pattern of the first trench, and the first region I except an overlap between the first region I and the first trench is used for defining the shape and size of the groove. Therefore, by using an overlap between the pattern of the first mask 601 and the pattern of the second mask 602 in this implementation, the groove can be smaller in size, further facilitating, without changing limiting conditions of the photolithography process, implementation of a smaller critical dimension of the target pattern and further compression of a pitch between the target patterns, to meet requirements of the high density and high integration of an IC. Besides, with reasonable alteration on the existing process, the process is low in complexity and is highly friendly to the photolithography process.

In some implementations, the first mask 601 is used as a mask for etching the mandrel material layer 520. Specifically, the first mask 601 is used for forming a mask layer. The first trench is formed by etching the mandrel material layer 520 by using the mask layer as a mask.

In some implementations, the second mask 602 is used as a mask for performing ion doping on the mandrel material layer 520 in the second region II. Specifically, the second mask 602 is used for forming a shielding layer located in the first region. The anti-etching layer is formed by performing ion doping on the mandrel material layer 520 in the second region by using the shielding layer as a mask, the ion doping being suitable for increasing the etching resistance of the mandrel material layer, the mandrel material layer not doped with ions that is located in the first region serving as the mandrel layer.

The ion doping is suitable for increasing the etching resistance of the mandrel material layer 520. Therefore, after the ion doping is performed on the mandrel material layer 520 by using the shielding layer formed by the second mask 602 as a mask, the etching resistance of the mandrel material layer 520 in the second region II (that is, the anti-etching layer) is correspondingly greater than the etching resistance of the mandrel material layer 520 in the first region I (that is, the mandrel layer). The mandrel layer is used for occupying a space for forming the groove.

In some implementations, the photolithography process is a positive photolithography process. The first pattern 610 is a light receiving pattern. The second pattern 620 is a light shielding pattern. Correspondingly, when exposure and development processes are performed on a photoresist by using the first mask 601, an opening pattern corresponding to the first pattern 610 is formed in a photoresist layer on a wafer; and when exposure and development processes are performed on the photoresist by using the second mask 602, a shielding pattern corresponding to the second pattern 620 is formed in the photoresist layer on the wafer.

In another implementation, the photolithography process may be further a negative photolithography process. The first pattern is a light shielding pattern. The second pattern is a light receiving pattern. Correspondingly, an opening pattern corresponding to the first pattern and a shielding pattern corresponding to the second pattern 620 can be also formed in a photoresist layer on a wafer.

It should be noted that for convenience of illustration and description, merely one second pattern 620 is illustrated in the second mask 602 in this implementation. However, the shape, quantity, and position of the second pattern 620 are not limited thereto. In another implementation, the pattern of the second mask is flexibly adjusted correspondingly according to the actual shape, quantity, and position of the first region. For example, when there is a plurality of first regions which is arranged along the second direction, the first regions of the plurality of first regions being separated from each other, correspondingly, there are a plurality of second patterns which are arranged along the second direction.

It should be further noted that in the semiconductor structure formed according to actual requirements, other pattern structures may be further disposed in the second mask 602, for example, a pattern used for forming a second trench. For specific descriptions of the second trench, reference may be made to the corresponding descriptions in the above forms as details are not described herein again.

In addition, in other implementations, when there is a plurality of second patterns, the pattern of the first mask may be also flexibly adjusted correspondingly. For example, there is also a plurality of first patterns in the first mask which correspond to the second patterns in the second mask. In another example, the first patterns in the first mask merely correspond to some of the second patterns in the second mask.

In some implementations, the first trench includes a first side wall along the second direction, and a second side wall opposite to the first side wall and parallel to the first side wall; and the first pattern 610 is set to that the first trench runs through the mandrel material layer 520 in the first region I along the first direction; or the first trench runs through the mandrel material layer 520 in the first region I along the first direction, and any one or both of the first side wall and the second side wall further extend into the mandrel material layer 520 in the neighboring second region II.

Correspondingly, after the semiconductor structure is treated using the mask in this implementation, along the second direction, the mandrel layers at two sides of the first trench are spaced apart by the first trench.

Figure 29:
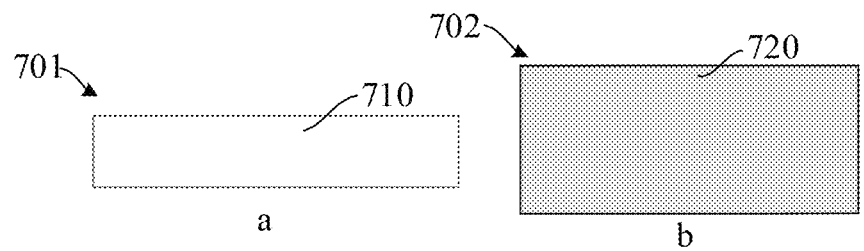
FIG. 29 is a schematic structural diagram of another form of a mask.
Figure 30:
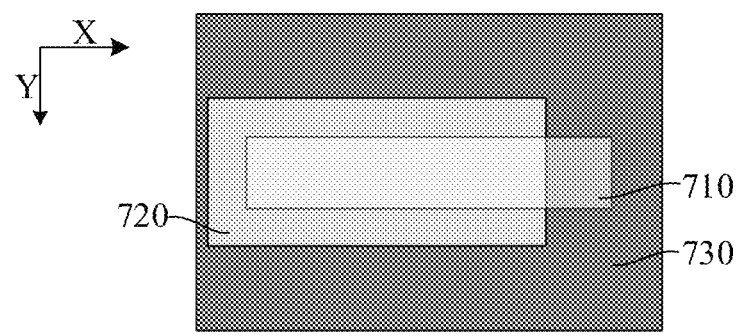
FIG. 30 is a schematic diagram of treating a semiconductor structure using the mask in FIG. 29.

FIG. 29 is a schematic structural diagram of another form of a mask according to the present disclosure. FIG. 30 is a schematic diagram of treating a semiconductor structure by using the mask in FIG. 29. FIG. 29a is a schematic diagram of a first mask 701. FIG. 29b is a schematic diagram of a second mask 702. The similarities between this form and the aforementioned forms are omitted here. A difference between this form and the above forms lies in:

The first trench includes a first side wall along a second direction, and a second side wall opposite to the first side wall and parallel to the first side wall; the first pattern 710 is set to that the first side wall of the first trench is located in the first region, and there is a space between the first side wall and a boundary of the first region at the same side; and the second side wall of the first trench is flush with a boundary of the first region at the same side, or the second side wall of the first trench is located in the neighboring second region. Usually, spacers are formed on side walls of the first trench, so that the spacers form a first groove by encircling it.

Therefore, after the first trench is formed using the first mask 701, and a mandrel layer and an anti-etching layer are formed by performing ion doping on a mandrel material layer 730 using the second mask 702, the mandrel layers communicate with each other at the position of the first side wall. Correspondingly, in a step of removing the mandrel layer, formed second grooves communicate with each other at the position of the first side wall, enabling the second groove to extend along the first direction, and the second groove outside the first side wall to extend along the second direction, so that an overlap between the pattern of the first mask 701 and the pattern of the second mask 702 is used to enable the pattern of the second groove to be a two-dimensional pattern, improving the design freedom of the target pattern. Besides, compared with a process in which a two-dimensional pattern is implemented by using a pattern of a mask, the process difficulty is reduced and the photolithography process window is enlarged in this embodiment.

Figure 31:
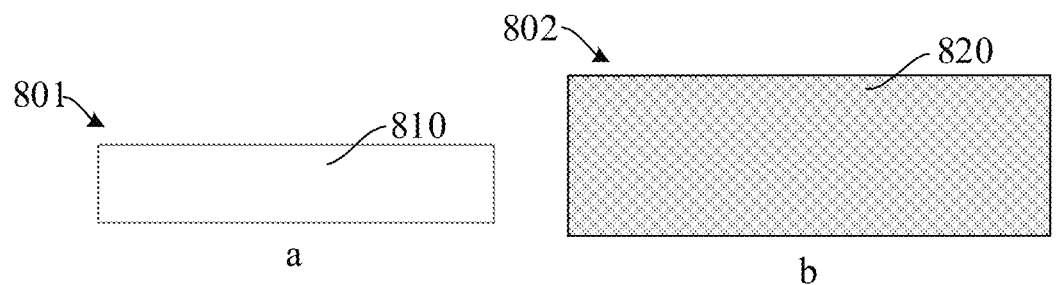
FIG. 31 is a schematic structural diagram of yet another form of a mask.
Figure 32:
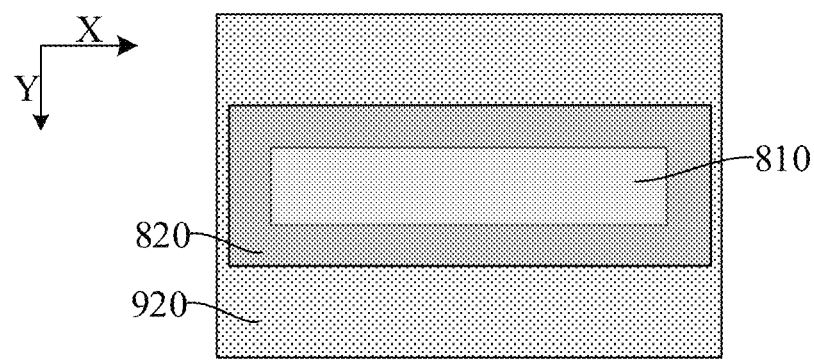
FIG. 32 is a schematic diagram of treating a semiconductor structure using the mask in FIG. 31.

FIG. 31 is a schematic structural diagram of yet another form of a mask. FIG. 32 is a schematic diagram of treating a semiconductor structure using the mask in FIG. 31. FIG. 31a is a schematic diagram of a first mask 801. FIG. 31b is a schematic diagram of a second mask 802. The similarities between this form and the aforementioned forms are omitted here. A difference between this form and the above forms lies in:

The first pattern 810 is set to that the first trench is located in the mandrel material layer 830 in the first region and along the first direction, there is a space between the side wall of the first trench and a boundary of the first region at the same side. Usually, spacers are formed on side walls of the first trench, so that the spacers form a first groove by encircling.

Therefore, after the first trench is formed using the first mask 801, and a mandrel layer and an anti-etching layer are formed using the second mask 802, the mandrel layer encircles the first trench. Correspondingly, in a step of removing the mandrel layer, formed second grooves encircle the first groove, enabling the second grooves to extend both along the first direction and the second direction, so that an overlap between the pattern of the first mask 801 and the pattern of the second mask 802 is used to enable the pattern of the second groove to be a two-dimensional pattern, improving the design freedom of the target pattern.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure formation method, comprising:
   providing a base that comprises a target layer used for forming a target pattern;
   forming a mandrel material layer on the base, wherein the mandrel material layer comprises a first region used for forming a mandrel layer, and a second region encircling the first region and used for forming an anti-etching layer;
   performing ion doping on the mandrel material layer in the second region, the ion doping being suitable for increasing an etching resistance of the mandrel material layer, wherein the mandrel material layer doped with ions that is located in the second region serves as the anti-etching layer, and the mandrel material layer not doped with ions that is located in the first region serves as the mandrel layer;
   forming a first trench that runs through, along a first direction, at least part of the mandrel material layer in the first region, wherein a direction perpendicular to the first direction is a second direction, and part of the mandrel material layer in the first region remains at two sides of the first trench along the second direction, the first trench comprises a first side wall along the second direction, and a second side wall opposite to the first side wall and parallel to the first side wall, the second side wall of the first trench is flush with a boundary of the first region at the same side, or the second side wall of the first trench is located in the neighboring second region;
   forming spacers on side walls of the first trench, so that the spacers form a first groove by encircling the first groove;
   removing the mandrel layer after the ion doping is performed and the spacers are formed, and forming second grooves in the anti-etching layer that are located at two sides of the first groove; and
   etching, using the anti-etching layer and the spacers as masks, the target layer below the first groove and the second grooves, to form the target pattern.

2. The semiconductor structure formation method according to claim 1, wherein:
   in the step of forming the first trench, the first trench comprises a first side wall along the second direction, and a second side wall opposite to the first side wall and parallel to the first side wall;
   the first trench runs through the mandrel material layer in the first region along the first direction, or the first trench runs through the mandrel material layer in the first region along the first direction, and any one or both of the first side wall and the second side wall further extend into the mandrel material layer in the neighboring second region; and in the step of removing the mandrel layer, the second grooves are spaced apart.

3. The semiconductor structure formation method according to claim 1, wherein:

the first side wall of the first trench is located in the first region, and there is a space between the first side wall and a boundary of the first region at the same side; and in the step of removing the mandrel layer, the second grooves communicate with each other at the position of the first side wall.

4. The semiconductor structure formation method according to claim 1, wherein:

in the step of forming the first trench, the first trench is located in the mandrel material layer in the first region and along the first direction, and there is a space between the side wall of the first trench and a boundary of the first region at the same side; and in the step of removing the mandrel layer, the second grooves encircle the first groove.

5. The semiconductor structure formation method according to claim 1, wherein:

the ion doping is performed on the mandrel material layer in the second region after the mandrel material layer is formed and before the first trench is formed; or the ion doping is performed on the mandrel material layer in the second region after the first trench is formed and before the spacers are formed; or the ion doping is performed on the mandrel material layer in the second region after the spacers are formed and before the mandrel layer is removed.

6. The semiconductor structure formation method according to claim 1, wherein the material of the mandrel material layer comprises at least one of amorphous silicon, polysilicon, silicon oxide, amorphous carbon, silicon nitride, amorphous germanium, silicon oxynitride, carbon nitride, silicon carbide, silicon carbonitride, or silicon oxycarbonitride.

7. The semiconductor structure formation method according to claim 1, wherein ions for ion doping comprises at least one of boron ions, phosphorus ions, or argon ions.

8. The semiconductor structure formation method according to claim 1, wherein the ion doping is performed on the mandrel material layer in the second region using an ion implantation process.

9. The semiconductor structure formation method according to claim 1, wherein the step of performing ion doping on the mandrel material layer in the second region comprises:

forming a shielding layer on the mandrel material layer in the first region, wherein the shielding layer exposes the second region;

performing ion doping on the mandrel material layer using the shielding layer as a mask; and removing the shielding layer.

10. The semiconductor structure formation method according to claim 1, wherein the step of forming the first trench comprises:

forming a mask layer on the mandrel material layer, wherein the mask layer comprises a mask opening extending along the first direction, wherein on a projection surface parallel to the base, the first region spans the mask opening along the second direction;

removing the mandrel material layer below the mask opening using the mask layer as a mask, to form the first trench; and removing the mask layer.

11. The semiconductor structure formation method according to claim 10, wherein the mandrel material layer below the mask opening is removed using a dry etching process and using the mask layer as a mask.

12. The semiconductor structure formation method according to claim 1, wherein an etching selection ratio of the mandrel layer to the anti-etching layer is at least 20:1.

13. The semiconductor structure formation method according to claim 1, wherein:

there is a plurality of first regions which are arranged along the second direction, wherein the first regions of the plurality of first regions are separated from each other; and the semiconductor structure formation method further comprises:

forming, after the mandrel material layer is formed and before the spacers are formed, a second trench running through the mandrel material layer which is located along the second direction between the first regions, wherein:

in the step of forming the spacers, the spacers are further formed on side walls of the second trench, and the spacers on the side walls of the second trench form a third groove by encircling; and etching, using the anti-etching layer and the spacers as masks, the target layer below the first groove, the second grooves, and the third groove, to form the target pattern.

14. The semiconductor structure formation method according to claim 1, wherein a process of removing the mandrel layer comprises a wet etching process.

15. The semiconductor structure formation method according to claim 1, wherein:

the target layer is a dielectric layer and the target pattern is an interconnect trench; and the semiconductor structure formation method further comprises: forming a metal interconnection line in the interconnect trench after the interconnect trench is formed.

16. A mask, used for forming a semiconductor structure, wherein:

the semiconductor structure comprises:

a base, comprising a target layer used for forming a target pattern; and a mandrel material layer located on the base, the mandrel material layer comprising a first region used for forming a mandrel layer, and a second region encircling the first region and used for forming an anti-etching layer, wherein the etching resistance of the anti-etching layer is greater than the etching resistance of the mandrel layer; and the mask comprises:

a first mask, comprising a first pattern, wherein the first pattern is used for forming a first trench that runs through, along a first direction, at least part of the mandrel material layer in the first region, a direction perpendicular to the first direction being a second direction, and the first pattern is set to that part of the mandrel material layer in the first region remains at two sides of the first trench along the second direction, the first trench comprises a first side wall along the second direction, and a second side wall opposite to the first side wall and parallel to the first side wall, the second side wall of the first trench is flush with a boundary of the first region at the same side, or the second side wall of the first trench is located in the neighboring second region; and a second mask, matching the first mask, wherein the second mask comprises a second pattern, and the second pattern is used for forming the mandrel layer located in the first region.

17. The mask according to claim 16, wherein:

the first trench comprises a first side wall along the second direction, and a second side wall opposite to the first side wall and parallel to the first side wall; and the first pattern is set so that the first trench runs through the mandrel material layer in the first region along the first direction or the first trench runs through the mandrel material layer in the first region along the first direction, and any one or both of the first side wall and the second side wall further extends into the mandrel material layer in the neighboring second region.

18. The mask according to claim 16, wherein:

the first pattern is set so that the first side wall of the first trench is located in the first region, and there is a space between the first side wall and a boundary of the first region at the same side.

19. The mask according to claim 16, wherein the first pattern is set so that the first trench is located in the mandrel material layer in the first region and along the first direction, there is a space between the side wall of the first trench and a boundary of the first region at the same side.

20. The mask according to claim 16, wherein:

the first mask is used for forming a mask layer, the first trench being formed by etching the mandrel material layer using the mask layer as a mask; and the second mask is used for forming a shielding layer located in the first region, the anti-etching layer being formed by performing ion doping on the mandrel material layer in the second region using the shielding layer as a mask, the ion doping being suitable for increasing the etching resistance of the mandrel material layer, the mandrel material layer not doped with ions is located in the first region serving as the mandrel layer.

* * * * *